US007672461B2

(12) United States Patent
Risch et al.

(10) Patent No.: US 7,672,461 B2
(45) Date of Patent: Mar. 2, 2010

(54) METHOD AND APPARATUS FOR CREATING A VIRTUAL THIRD CHANNEL IN A TWO-CHANNEL AMPLIFIER

(75) Inventors: Jon M. Risch, Toomsuba, MS (US); Emmett E. Heath, Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 1199 days.

(21) Appl. No.: 11/229,883

(22) Filed: Sep. 19, 2005

(65) Prior Publication Data

US 2006/0013406 A1 Jan. 19, 2006

Related U.S. Application Data

(62) Division of application No. 10/286,047, filed on Nov. 1, 2002, now Pat. No. 7,251,333.

(51) Int. Cl.
*H04R 5/00* (2006.01)
*H04R 1/02* (2006.01)
*H03F 99/00* (2009.01)

(52) U.S. Cl. ............................ 381/27; 381/89; 381/120

(58) Field of Classification Search ............. 381/97–99, 381/1, 27, 180, 61, 120, 89, 17
See application file for complete search history.

(56) References Cited

U.S. PATENT DOCUMENTS 4,137,510 A 1/1979 Iwahara ......................... 333/6
4,403,112 A 9/1983 Modafferi ....................... 179/1
5,673,326 A 9/1997 Goldfarb ...................... 381/99
6,181,796 B1 1/2001 Johnson ........................ 381/28
6,529,787 B2 3/2003 Weikel et al. ................. 700/94
2001/0018621 A1* 8/2001 Weikel et al. ................. 700/94

OTHER PUBLICATIONS

McCann, Marty, "*How to Get +6 dB More Performance Out of Your System With No Additional Financial Investment*," Peavey Monitor, vol. 15, Issue 2, ©1996, pp. 30-32.

* cited by examiner

*Primary Examiner*—Vivian Chin
*Assistant Examiner*—Douglas J Suthers
(74) *Attorney, Agent, or Firm*—Thomas, Kayden, Horstemeyer & Risley, LLP

(57) ABSTRACT

A method and apparatus for creating a third signal channel from an input signal received in each of a first and second channel involves inverting a predetermined frequency range of signals in the first channel out of phase with a corresponding frequency range of signals in the second channel. Thereafter, the inverted signal in the first channel and the corresponding frequency signal in the second channel may be communicated to a speaker, which is bridged across the first and second channels, as the third signal channel. This speaker produces sound corresponding to the difference (i.e., the frequency range determined by the predetermined bandwidth of the inverted signal) between the inverted signal in the first channel and the corresponding frequency signal in the second channel.

10 Claims, 3 Drawing Sheets

METHOD AND APPARATUS FOR CREATING A VIRTUAL THIRD CHANNEL IN A TWO-CHANNEL AMPLIFIER

CROSS-REFERENCE TO RELATED APPLICATION

This application is a divisional of U.S. utility application entitled, "Method and Apparatus for Creating a Virtual Third Channel In A Two-Channel Amplifier," having Ser. No. 10/286,047, filed Nov. 1, 2002 now U.S. Pat. No. 7,251,333, which is entirely incorporated herein by reference.

FIELD OF THE INVENTION

The present invention generally relates to stereo amplifiers and, more specifically, to an apparatus and method for converting a two-channel amplifier into a virtual three-channel amplifier.

BACKGROUND OF THE INVENTION

High and low signal frequencies, also known as treble and bass signal frequencies respectively, are replicated as sound based upon the electrical signal received by the left and right speakers, as output by a stereo amplifier in a typical configuration. The left and right speakers respond to both the high treble frequencies and the low bass frequencies. Because the left and right speakers are required to produce such a broad spectrum of frequencies, it is common that many loudspeakers fail to produce the lower bass frequencies in a desirable manner. Stated another way, it is not uncommon for bass frequencies to lose their dynamic effect when the left or right speaker is called upon to output sound covering such a broad frequency spectrum. Thus, it is well known that an additional third speaker, known as a subwoofer, may be added to reproduce the lower bass frequencies to emphasize the bass in the reproduced sound.

A typical output from a stereo amplifier includes left and right channel outputs that are electrically coupled to a pair of loudspeakers for reproducing sound corresponding to signals amplified by the stereo amplifier. To create these left and right output channels, a typical amplifier includes two separate power amplifier channels—one for the left output and the other for the right output. Thus, stereo amplifiers that are not equipped with a third powered amplifier channel (which is generally more expensive than a two-channel amplifier) generally cannot be implemented with a subwoofer.

Attempts have been made with varied degrees of success to integrate a subwoofer with a stereo amplifier having two output channels. One possibility for a two-channel stereo amplifier to power a subwoofer is simply to add a third amplifier channel. This option, however, is generally impracticable, since it involves essentially changing the configuration of the stereo amplifier to support the third amplifier channel. It is much more cost-efficient if the third output channel is incorporated in the stereo amplifier at the manufacturing stage, so any post manufacturing modification in this regard is inefficient and costly.

Other potential solutions attempt to capitalize on the fact that typical prerecorded music has bass that is present in both channels equally. With this common practice, it is possible to use a single subwoofer for both channels.

Accordingly, one possibility is to configure a two-channel stereo amplifier so that it supports a third speaker subwoofer through the implementation of a passive crossover circuit. Crossover circuits are commonly used with speakers because no one speaker can produce the entire audio spectrum alone. Tweeter speakers are not configured to produce deep bass, and subwoofers are not configured to produce vocals and other high frequencies with any clarity. This passive crossover solution involves two steps. First, the input of one of the channels has its signal inverted with respect to the remaining channel, and the corresponding stereo speaker connection to this same channel is also inverted. Second, this solution involves placing a subwoofer in a bridge passive crossover connection to the two amplifier channel's "hot" (plus (+) or positive) output terminals with an inductor positioned in series between one of the amplifier's output terminals and the subwoofer input. This inductor placement is known as a passive first order crossover. The passive first order crossover circuit may be implemented so that it does not sum the left and right channel bass information, which, as stated above, is commonly present in both left and right channels equally.

The inductor is simply a coil of wire that typically is wrapped around a permeable ferrite or other type of iron core. The effect of the permeable core is that the inductance of the coil increases in direct proportionality to the permeability of the core as compared to an air core. Thus, an inductor can be made significantly smaller in physical size by incorporating a permeable core. The inductor has the electrical characteristic that its impedance increases proportionally to the frequency of the incoming signal. This increased impedance results in a decrease in stereo amplifier's output, which means that higher frequencies are attenuated at a rate determined by the slope of the crossover filter. Thus, the inductor creates frequency-dependent impedance and operates to roll off the high frequencies so that the high frequencies are not "seen" by the subwoofer.

A passive crossover circuit composed of a simple series inductor, however, cannot remove all of the unwanted frequencies, but it can reduce the output, or roll off, those frequencies to inaudible levels. The passive crossover rolls off the frequencies above a preset frequency cut-off so that just the deep bass frequencies, which may be, for example, 100 Hz and less, are passed to the subwoofer. The frequency cut-off is generally set so that the subwoofer does not attempt to reproduce the higher frequency signals (i.e., frequencies above 100 Hz), as the subwoofer is neither designed nor capable of responding to the demands of higher frequencies.

The problem with this configuration is that even with placing the inductor in series between the subwoofer and one of the channel outputs, an insufficient amount of the midrange frequencies are removed from the output signal prior to reaching the subwoofer. This situation occurs because the passive crossover circuit is a first order crossover, which reduces unwanted frequencies by approximately 6 dB per octave.

The passive crossover circuit may be configured as a second order filter with the addition of a shunt capacitor positioned across the subwoofer's input in an effort to increase the rate of roll off of higher frequency signals. However, due to the addition of the inductor and/or capacitor elements, the cost of these configurations is greater and therefore not desirable. Additionally, some amplifier power is lost in the finite resistance of the inductor wire, the equivalent series resistance, and dielectric absorption of the capacitor.

As another possibility, a dual voice coil subwoofer speaker, configured such that both voice coils drive a common cone in straight polarity, may be used with two passive crossover circuits in similar fashion as described above. A pair of passive crossover circuits in conjunction with a dual voice coil subwoofer may be configured to split the low-frequency audio spectrum so that the left and right channel outputs are each communicated to a separate voice coil on the subwoofer for reproducing the low-frequency sounds. More specifically, a signal corresponding to the left channel bass frequencies is communicated to a first voice coil on the subwoofer, and a signal corresponding to the right channel bass frequencies is communicated to a second voice coil on the subwoofer. The effect of the two separate signals on the two separate voice coils is that the subwoofer cone responds to each voice coil to produce low-frequency sound.

The disadvantage of this implementation is a loss of amplifier power recognized by the subwoofer. In order to roll off the higher frequencies, two inductors are utilized—one coupled between each output of the stereo amplifier and its respective connection to the subwoofer. Even with low resistance inductor coils, there is some volume reduction. This loss is due primarily to the size and the number of wire windings of each inductor. As a result, this is an inefficient solution.

This dual voice coil subwoofer speaker itself is also more costly due to the dual coil windings on the two voice coils and the complex manufacturing involved. Single voice coil speakers are more common and thereby less expensive than dual voice coil speakers.

Another possibility involves directly connecting the subwoofer to both stereo amplifier channel outputs dual-primary winding, high-current, mixing transformer positioned in the path prior to the subwoofer. The mixing transformer operates to passively sum the bass in each channel. However, the effect of implementing the transformer compromises subwoofer performance. Moreover, the cost of the mixing transformer is undesirably high due in part to the size of the transformer for proper configuration. Thus, for this reason, this alternative solution is also inefficient and undesirably expensive.

Thus, a heretofore unaddressed need exists to address the deficiencies and problems described above.

SUMMARY OF THE INVENTION

Embodiments of the present invention provide a method and apparatus for creating a third signal channel from an input signal received in each of a first and second channel. The method may be implemented by inverting a predetermined frequency range of signals in the first channel out of phase with a corresponding frequency range of signals in the second channel. Thereafter, the inverted signal in the first channel and the corresponding frequency signal in the second channel may be communicated to a third channel speaker, which is bridged across the first and second channels, as the third signal channel. The third channel speaker produces sound corresponding to the difference (i.e., frequency range determined by the predetermined bandwidth of the inverted signal) between the inverted signal in the first channel and the corresponding frequency signal in the second channel.

An alternative embodiment to the method described above includes shifting a predetermined frequency range of signals in the first channel out of phase with the input signal in the first channel. The shifted signals may then be inverted so that a predetermined frequency range of signals in the inverted signal in the first channel is out of phase with a corresponding frequency range of signals in the second channel. As before, the inverted signal in the first channel and the corresponding frequency signal in the second channel may be communicated to a third channel speaker, which is bridged across the first and second channels, as the third signal channel. The third channel speaker produces sound corresponding to the difference (i.e., frequency range determined by the predetermined bandwidth of the phase-shifted signal) between the inverted signal in the first channel and the corresponding frequency signal in the second channel.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components of the drawings are not necessarily to scale, with emphasis instead placed upon clearly illustrating the principles of the present invention. Moreover, in the drawings, like reference numerals designate corresponding parts through the several views.

DETAILED DESCRIPTION OF THE PREFERRED EMBODIMENT

Figure 1:
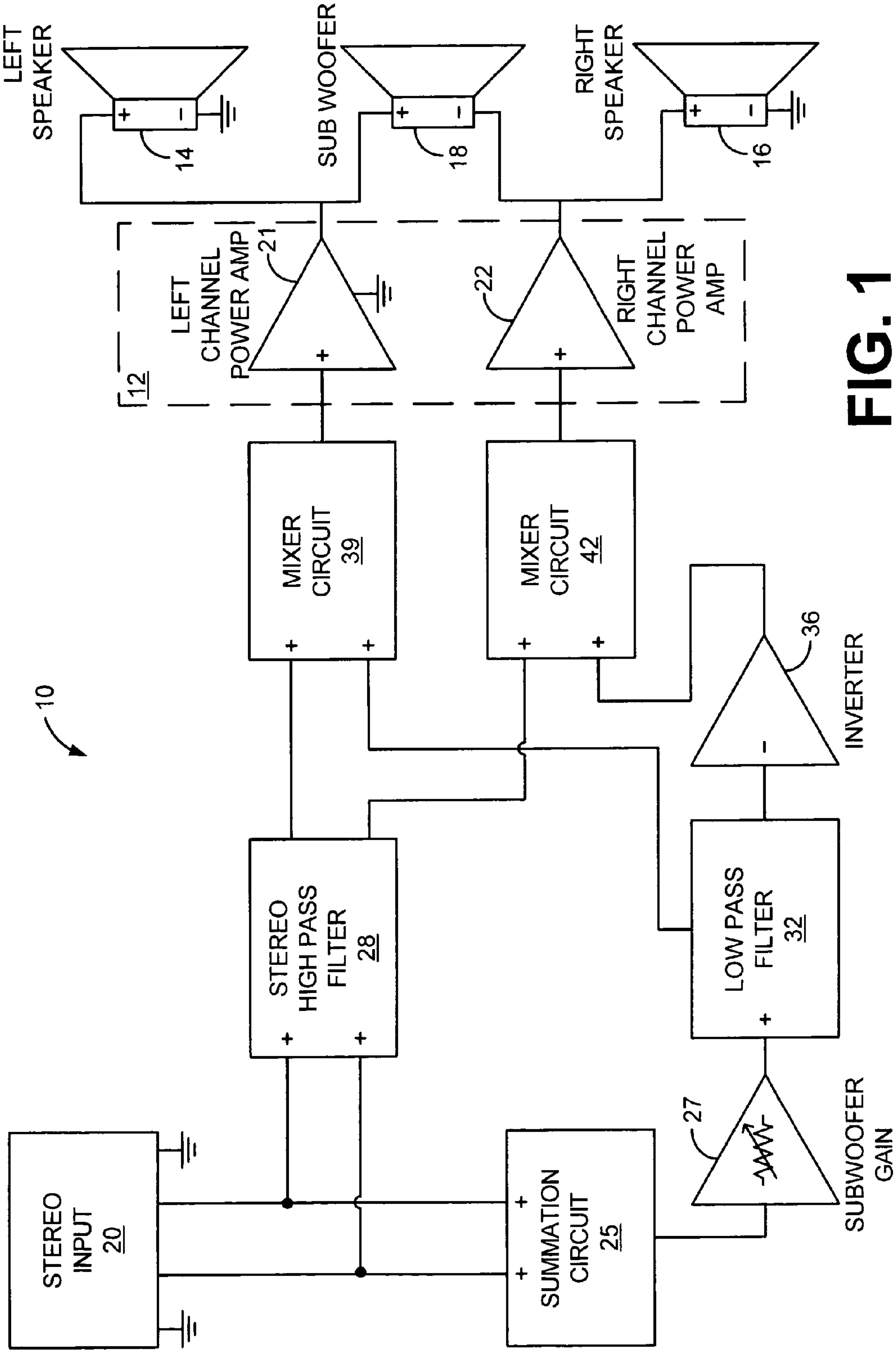
FIG. 1 is a schematic diagram of a stereo amplifier, left and right speakers, and a subwoofer with frequency selective signal inversion circuitry for creating a virtual third channel in the amplifier.

FIG. 1 is a schematic diagram 10 depicting a stereo amplifier 12 coupled to a left speaker 14, a right speaker 16, and a subwoofer speaker 18 in a bridged configuration. Stereo input device 20 may be any component that outputs a two-channel line level signal corresponding to a signal to be reproduced by speakers 14, 16, and 18. The two channels output by stereo input device 20 are in phase relative to each other. Stereo input device 20, in practice, typically isolates the signal source (not shown) (i.e., presenting a relatively high-impedance, typically in a range of 10 to 1000 times the source impedance), which may be, as a non-limiting example, a CD player.

Contained within stereo amplifier 12 is a left channel power amplifier 21 (hereinafter "left amp 21") and a right channel power amplifier 22 (hereinafter "right amp 22"). Both of left and right amps 21, 22 operate to increase the amplitude of an input signal received by stereo amplifier 12 for communication to speakers 14, 16, and 18.

Stereo amplifier 12 may be a preexisting unit such that the inverting input of the right amp 22 is inaccessible or even nonexistent. In fact, stereo amplifier 12 may be configured to receive just a left and right input, which is amplified by left and right amps 21 and 22 to produce two outputs. Thus, this embodiment is configured to invert and mix the high and low frequency components of the right channel prior to communicating the right channel signal to stereo amplifier 12.

Summation circuit 25 combines the left and right channel inputs received from stereo input device 20 to produce a summed, or monophonic, output channel. Because the low frequency signals are typically the same in both the left and right channel inputs to summation circuit 25, the summed output from summation circuit 25 is approximately 6 dB higher in the low frequencies. Stated another way, since the low frequencies are in phase, the result in output is increased by approximately 6 dB; and since the higher frequency signals are generally not consistently in phase in the separate channels, the higher frequency signals do not sum in the same manner.

The output from summation circuit 25 is communicated to subwoofer gain amplifier 27. Subwoofer gain amplifier 27 is configured to adjust the differential signal recognized by subwoofer 18 from zero to a predetermined maximum value. If the gain of subwoofer gain amplifier 27 is set to zero, then subwoofer gain amplifier 27 produces no output, which results in no bass sounds produced by subwoofer 18 or even left or right speakers 14 and 16, respectively. However, upon increasing the gain at subwoofer gain amplifier 27 to a value above zero, the output from this amplifier causes a differential signal to be recognized across the inputs of subwoofer 18, which causes the subwoofer 18 to produce sonic output.

Even though subwoofer gain amplifier 27 is shown positioned prior to low pass filter 32, one of ordinary skill in the art would know that these two items (as well as many of the other components in FIG. 1) may be positioned so that the low pass filter 32 precedes the subwoofer gain amplifier 27.

The signal output by a subwoofer gain amplifier 27, as stated above, is a monophonic signal. Thus, not only does the output from subwoofer gain amplifier 27 include low frequency information, but the output also includes the mid and higher range frequency signals as well. Consequently, low pass filter 32 operates to pass the low frequency signals within a predetermined low frequency range (as a non-limiting example, up to 100 Hz) such that any mid or high frequency signals are not passed by the filter. Thus, the output of low pass filter 32 represents the compounded and amplified bass frequency signal produced by summation circuit 25 and subwoofer gain amplifier 27. The mid and higher range frequencies, which are filtered by low pass filter 32, are communicated to speakers 14 and 16 through a separate part of circuit 10, as described herein below.

The left and right signals generated by stereo input device 20 are communicated to high pass filter 28. High pass filter 28 operates to pass the mid and high frequency signals that are above the predetermined frequency range to the remainder of circuit 10. Thus, the low frequency information is not passed by high pass filter 28, as it routed through a separate part of circuit 10. More specifically, the low frequency information is routed through summation circuit 25, subwoofer gain amplifier 27 and on through low pass filter 32 to the remaining components of circuit 10, while the high frequency information is routed through high pass filter 28 to the remainder of circuit 10.

The left channel output by high pass filter 28 is communicated to mixer circuit 39. The signal communicated to mixer circuit 39 from high pass filter 28 includes the mid and high range frequency information above a predetermined cutoff frequency range for the left channel. The low frequency signals are received in mixer circuit 39 from low pass filter 32. Thus, mixer circuit 39 receives both the high and low frequency that form the complete signal. Mixer circuit 39, therefore, operates to mix these low and high frequency signals into a single output signal that is communicated to left amp 21.

The output from low pass filter 32 is not only communicated to mixer circuit 39, but it is also coupled to inverter 36. Inverter 36 inverts the low frequency signal to produce an output signal that is 180 degrees out of phase with the corresponding low frequency signal in the left channel (corresponding to the signal communicated to mixer circuit 39 from low pass filter 32). As such, inverter 36 communicates an inverted low frequency signal to mixer circuit 42, which is similar in configuration to mixer circuit 39. Mixer circuit 42 operates to combine the inverted low frequency signal from inverter 36 with the right channel high frequency signal (passed by high pass filter 28) to produce an output that is communicated to right amp 22. Right amp 22, in this embodiment, operates to merely amplify the signal communicated from mixer circuit 42 in similar fashion as left amp 21. In this embodiment, right amp 22 does not invert the signal received from mixer circuit 42.

In this instance, the low frequency signal for the right channel is inverted prior to communication to right amp 22, which in this instance may be inaccessible within stereo amplifier 12. As such, summation circuit 25, subwoofer gain amplifier 27, low pass filter 32, inverter 36, mixer circuit 42, stereo high pass filter 28, and mixer circuit 39, may be configured in a separate unit apart from, but in electrical communication with, stereo amplifier 12. Thus, these components (bearing reference numerals 25, 27, 32, 36, 42, 28, and 39) may or may not be implemented within stereo amplifier 12, which is configured to produce a two-channel output, so as to produce a third subwoofer channel output for subwoofer 18.

In this embodiment that includes inverter 36 and mixer circuit 42, phase shifting of the low frequency signal in the right channel may be achieved so that the low frequency signals in the left and right channels are out of phase at subwoofer 18. Subwoofer 18 is coupled in bridged configuration, which means that it is connected between the two amplifier 12 output channels "hot" (plus (+) or positive) output terminals so that the differential between the low frequency signals in the left and right channels causes subwoofer 18 to produce low frequency sound.

Both the left and right channel amplifiers 21, 22 of stereo amplifier 12 operate to amplify the line level signal received by each amplifier for transmission to speakers 14 and 16 and to subwoofer 18. The output of left amp 21 is coupled to both the positive terminal of left speaker 14 and the positive terminal of subwoofer 18, in this non-limiting example. Likewise, the output signal from right amp 22 is coupled to the positive terminal of right speaker 16 and the negative terminal of subwoofer 18.

Left speaker 14 has the same potential on its positive terminal as the positive terminal of subwoofer 18, with respect to ground. As a result of this configuration, current flows, and speaker 14 produces the left channel signal. Similarly, right speaker 16 has the same potential in the positive terminal as the negative terminal of subwoofer 18, also with respect to ground. Thus, this configuration causes current to flow so that the right speaker 16 produces the right channel signal.

The low frequency information received by subwoofer 18 at its positive terminal (from left amp 21) is 180 degrees out of phase with the low frequency information received by subwoofer 18 at its negative terminal (from right amp 22). As a result of this differential low frequency signal that subwoofer 18 "sees," current flows, thereby causing speaker movement corresponding to the low frequency sound. No higher frequency sounds are produced by subwoofer 18, as those signals are substantially in-phase at the opposite polarity inputs of subwoofer 18 so that the signals cancel. In this configuration, the subwoofer 18 can operate without costly or power robbing passive crossovers, while allowing the left and right amps 21, 22 to provide a substantially full range signal to the left and right outputs and speakers connected thereto.

One of ordinary skill in the art would know that a high pass filter (not shown) may be inserted between left amp 21 and left speaker 14 as well as between right amp 22 and right speaker 16. Adding these two high pass filters operates to reduce the amount of bass that is communicated to the left and right speakers 14 and 16 regardless of the gain set at subwoofer gain amplifier 27.

In an alternative embodiment (not shown) to the circuit 10, as shown in FIG. 1, high pass filter 28 may be removed so that the left and right channel outputs from stereo input device 20 are directly communicated to mixer circuit 39. Because of this difference, mixer circuit 39 receives both high and low frequency information in each channel. Consequently, subwoofer gain amplifier 27 and the connection path between low pass filter 32 and mixer circuit 39 may also be removed, since mixer circuit 39 already receives low frequency information directly from stereo input device 20. The effect of this alternative embodiment omits gain control for the low frequency information communicated to subwoofer 18. Thus, the output from subwoofer 18 is fixed depending on the low frequency information in each channel, which, if equal in each channel, is approximately 6 dB higher than the output in either left or right speaker 14, 16.

Figure 2:
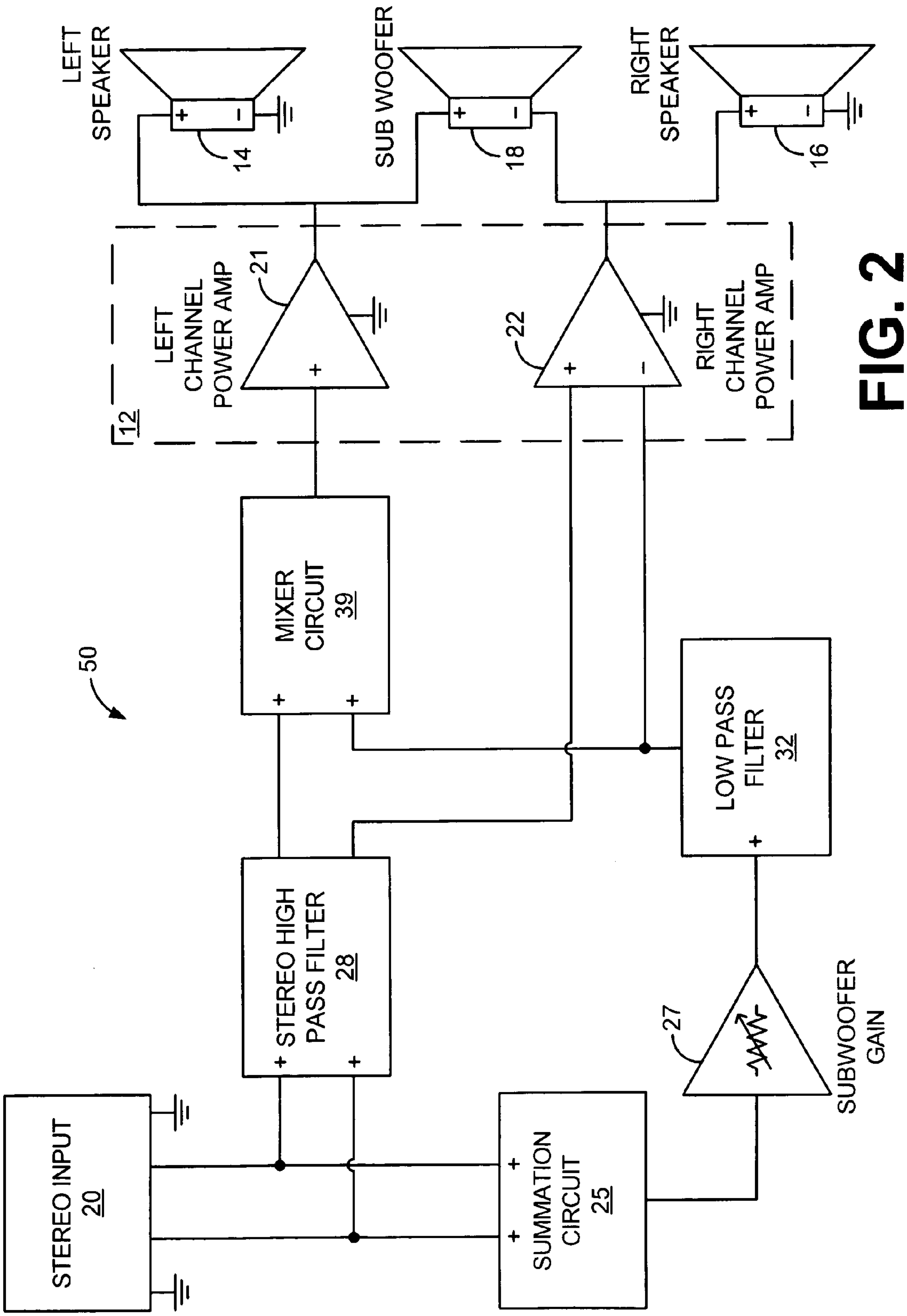
FIG. 2 is a schematic diagram of a stereo amplifier, and the left and right speakers and subwoofer of FIG. 1, with an alternative embodiment of the frequency selective signal inversion circuit.

FIG. 2 is a diagram 50 of an alternative embodiment of the frequency selective signal inversion circuit, as shown in FIG. 1. Stereo input device 20 provides a left and right channel output electrically isolated from its source. The signal communicated from stereo input device 20 is communicated to summation circuit 25 and is also split to high pass filter 28.

The signal is summed by summation circuit 25 and amplified according to the gain set on subwoofer gain amplifier 27. The summed and amplified signal output from the subwoofer gain amplifier 27 is filtered by low pass filter 32 in similar fashion to as described above. Just as above, the signal produced by low pass filter 32 is communicated to mixer circuit 39, which receives the left channel mid and high frequency signals communicated from high pass filter 28 and outputs a signal containing both low and high frequency information. The operation of components 25, 27, 28, 32, and 39 of circuit 50 is similar to the like-numbered components of circuit 10, as described above and shown in FIG. 1.

The output from low pass filter 32 is not only communicated to mixer circuit 39, but is also coupled to the inverting input of right amp 22. In this alternative embodiment, as shown in FIG. 2, right amp 22 receives the right channel high frequency signals from high pass filter 28 at its non-inverting input. The low frequency signals are communicated from the low pass filter 32 to the inverting input of the right amp 22. Accordingly, the amplified signal output by right amp 22 includes the right channel high frequency signal received from high pass filter 28 and low frequency signal received from low pass filter 32, which is inverted in the output of right amp 22.

The signals output by right amp 22 and left amp 21 are communicated to speakers 14, 16, and 18, in similar fashion as described hereinabove in reference to circuit 10 of FIG. 1. Accordingly, the mid and high range frequencies are produced by left and right speakers, respectively, based upon the corresponding outputs from left and right amps 21 and 22. Subwoofer 18 produces sound corresponding to the differential signal recognized across the inputs of subwoofer 18. As described above, the output from left amp 21 is communicated to the positive input of subwoofer 18, and the output from right amp 22 is communicated to the negative input of subwoofer 18. Thus, subwoofer 18 responds to the difference between the two signals, which corresponds to the bass frequency information in both of the left and right channels.

The left and right channel signals output by high pass filter 28 and input to mixer circuit 39 and the non-inverting input of right amp 22, respectively, are at the same polarity. As stated above, left amp 21 and right amp 22 amplify the left and right channel signals, respectively. Accordingly, subwoofer 18 receives a signal from left amp 21 and right amp 22 such that the higher frequencies are in phase. As a result, no current flows and no sound is produced by subwoofer 18 because the corresponding higher frequency signals at the opposite terminals of subwoofer 18 from the respective power amplifiers are in phase.

The low frequency signal communicated from low pass filter 32 is output to both the non-inverting input of the left amp 21 (via mixer circuit 39) and also to the inverting input of right amp 22, which produces a signal 180 degree phase shifted from the signal produced by left amp 21. The low frequency signals, therefore, on the positive and negative terminals of subwoofer 18 is 180 degrees out of phase, thereby causing current to flow in subwoofer 18. The current flow produces movement in the subwoofer 18, which results in low frequency sound.

It should be noted that left speaker 14 has the same potential on the positive terminal as the positive terminal of subwoofer 18 with respect to ground. As a result, current flows and left speaker 14 produces the left channel signal. Likewise, right speaker 16 has the same potential on its positive terminal, as does the negative terminal of subwoofer 18, also with respect to ground. As a result, current flows across right speaker 16, so that it produces the right channel signal.

Circuit 50, as shown in FIG. 2, may be implemented in a single chassis, or components 25, 27, 28, 32, and 39 may be part of a separate external processor unit electronically coupled to the left and right amps 21 and 22 for creating the virtual third channel. In the implementation shown in FIG. 2, the non-inverting input of right amp 22 is accessible so that the low frequency inversion may take place at right amp 22, which results in the low frequency information between the left and right channel outputs being 180 degrees out of phase. However, if the inverting input of one of the power amp is not accessible, the components 25, 27, 28, 32, and 39 may be placed in external module for coupling with a single input to the left and right amps 21 and 22, which may be implemented as shown in FIG. 1 and as described previously.

Figure 3:
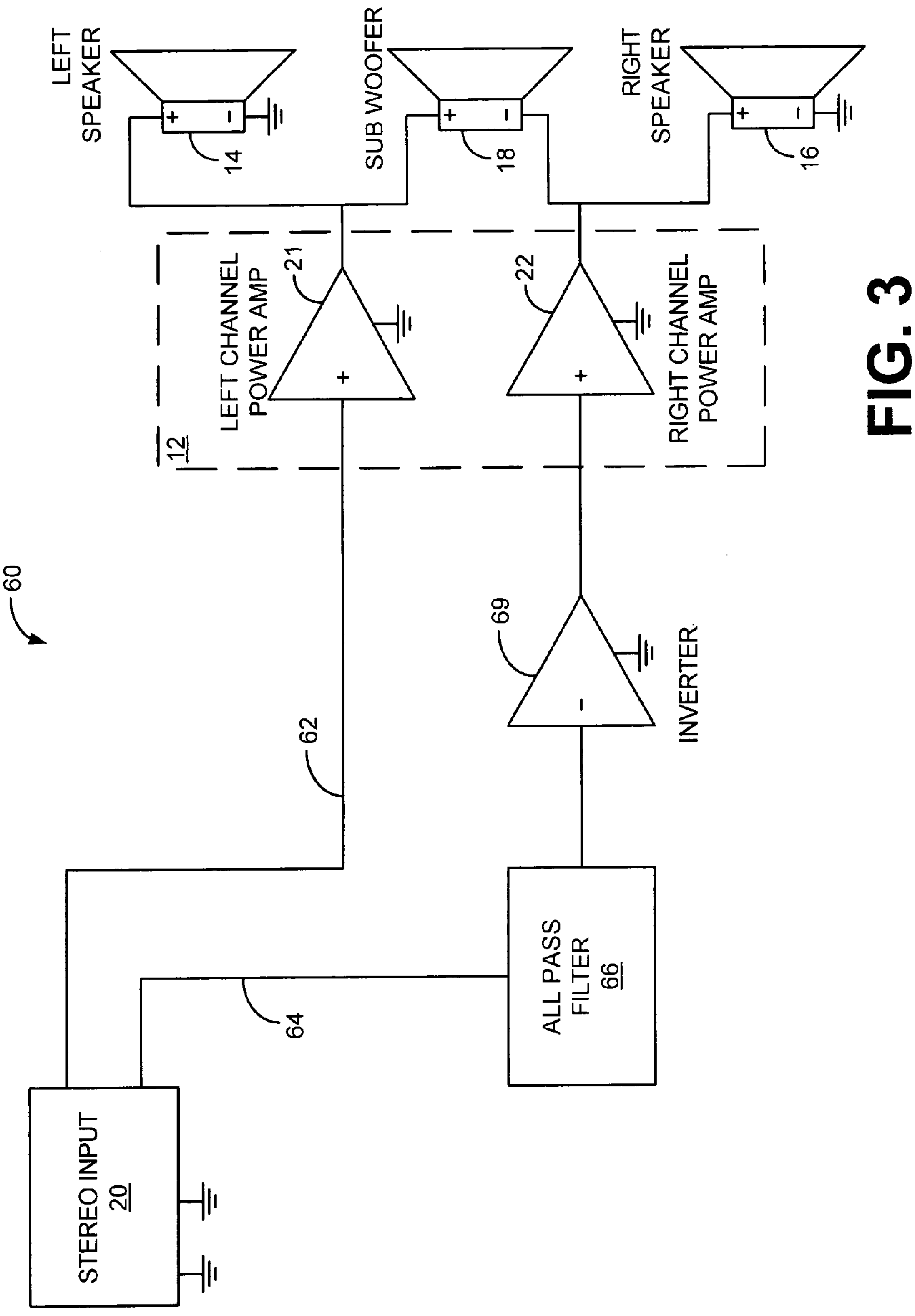
FIG. 3 is a diagram depicting the stereo amplifier, left and right speakers, and subwoofer of FIG. 1, as well as another alternative embodiment of the frequency selective signal inversion circuit.

FIG. 3 is a diagram 60 of an alternative embodiment of the circuit described above and depicted in FIG. 1. As shown in FIG. 3, the left channel 62 output from stereo input device 20 is forwarded to a left amp 21 in stereo amplifier 12. As such, the signal communicated on left channel 62 is not altered between stereo input device 20 and left amp 21.

The signal communicated from stereo input device 20 along right channel 64 is communicated to all pass filter 66. All pass filter 66 may be implemented as a constant amplitude phase shift network, as known in the art. All pass filter 66 shifts a range of higher frequency signals out of phase with the input signal produced by stereo input device 20. Thus, the output from all pass filter 66 is such that the higher frequency signals lag the signal produced by stereo input device 20 by 180 degrees.

The phase-shifted signal output by all pass filter 66 is communicated to inverter 69. Inverter 69 operates to invert the signal received from all pass filter 66. Thus, the higher frequency signals, which were shifted out of phase by all pass filter 66, are placed back into phase by inverter 69. In addition, the low frequency component of the signal output by inverter 69, is now shifted 180 degrees out of phase, as compared to the low frequency component of the signal communicated in left channel 62. This inverted signal is then communicated to the right amp 22 in stereo amplifier 12.

Just as above, both the left and right channel amplifiers 21, 22 of stereo amplifier 12 operate to amplify the line level signal received by each amplifier for transmission to speakers 14 and 16 and subwoofer 18. As shown in this non-limiting example, the left channel 62 and right channel 64 are communicated to the non-inverting inputs to respective left and right amps 21, 22.

The output of left amp 21 is coupled to both the positive terminal of left speaker 14 and the positive terminal of subwoofer 18, in this non-limiting example. Likewise, the output signal from right amp 22 is coupled to the positive terminal of right speaker 16 and the negative terminal of subwoofer 18.

Left speaker 14 has the same potential on its positive terminal as the positive terminal of subwoofer 18, with respect to ground. As a result of this configuration, current flows and speaker 14 produces the left channel signal. Similarly, right speaker 16 has the same potential in the positive terminal as the negative terminal of subwoofer 18, also with respect to ground. Thus, this configuration causes current to flow so that the right speaker 16 produces the right channel signal.

The low frequency information received by subwoofer 18 at its positive terminal (from left amp 21) is 180 degrees out of phase with the low frequency information received by subwoofer 18 at its negative terminal (from right amp 22). As a result of this differential low frequency signal that subwoofer 18 "sees," current flows, thereby causing speaker movement corresponding to the low frequency sound. No higher frequency sounds are produced by subwoofer 18, as those signals are substantially in-phase at the opposite polarity inputs of subwoofer 18 so that the signals cancel. In this configuration, the subwoofer 18 can operate without costly or power robbing passive crossovers, while allowing the left and right amps 21, 22 to provide a substantially full range signal to the left and right outputs and speakers connected thereto.

Even if the signal generated by stereo input device 20 and communicated on left and right channels 62, 64 has a different signal at low frequencies (such that bass is not equal in each channel), subwoofer 18 will respond with a reduced output level of up to approximately 6 dB less than if the signal is equally present in both channels. This reduced output results from the fact that when the signals are equal in both channels, the effect is that the signals are compounded. Thus, when the low frequency signals are different in each channel, the differential signal is still greater in amplitude than the signal in either channel individually, but it is less than the doubled amplitude signal for when the two left and right low frequency signals are the same. Thus, subwoofer 18 will still primarily produce bass frequencies.

All pass filter 66 is configured such that the center of the all pass filter's phase shift is at a desired nominal crossover frequency for subwoofer 18. Subwoofer 18, in this embodiment, is subject to a differential signal of the low frequencies, while higher frequencies remain substantially in phased as output by left and right amps 21, 22.

It should be noted that the rate of roll off of the higher frequencies is controlled by the rate of change of the phase shift of all pass filter 66, which may be controlled by a stable first order all pass circuit. Higher order all pass networks with a high Q may increase the slope of the high frequency roll off. However, with the additional circuitry that comes with a higher order network (i.e. additional resistors, capacitors and inductors), the complexity and precision tolerance of the parts substantially increases.

The level of subwoofer 18 is fixed at approximately 6 dB above the level of the left and right channel outputs produced by left amp 21 and right amp 22. This effect results due to the fact the subwoofer sees the low frequency input from left amp 21 at the positive terminal and the inverted signal along right channel path 24, as output by right amp 22 in the negative terminal of subwoofer 18. Consequently, the signals received at each of the subwoofer's 18 inputs are added together, which results in approximately a 6 dB increase level if the bass information is equal in each channel as described above.

The embodiment depicted in FIG. 3 varies from the embodiments depicted in either of FIG. 1 or 2 in at least two respects. As described above, the level of the subwoofer output in FIG. 3 is fixed at approximately 6 dB above the left and right channel outputs for any given input level, that is, if the low frequency information is equal in each channel. However, in the embodiment described in either of FIGS. 1 and 2, the subwoofer gain amplifier 27 enables the level of the subwoofer output to be adjustable, which also affects the amount of bass present in the left and right speakers 14 and 16.

In addition, the embodiments depicted in FIGS. 1 and 2 do not include an all pass filter, as described above and as shown in FIG. 3. Accordingly, the embodiments of FIGS. 1 and 2 are not affected by any rate of high frequency roll-off that results from the phase shift.

It should also be noted that the low frequency signal output by right amp 22 to right speaker 16, in the embodiment depicted in FIG. 3, is phase shifted by all pass filter 66 relative to the rest of the frequency band. While this situation may not be noticeable to a listener, it is a deviation from the original signal.

In each of the embodiments shown herein, subwoofer 18 is able to operate without costly or power-robbing passive crossovers, as described above, while also providing a substantially full range signal to both the left and right speakers 14, 16 coupled to the outputs of left and right amps 21 and 22, respectively. It should also be noted that in each of the embodiments described herein, power amplifier 12 can be a separate component or an integral part of an complete system composed of any and all circuit stages from stereo input 20 up to and including speakers 14, 16 and 18.

It should also be noted that although the embodiment shown in FIGS. 1-3 show the inversion of the bass frequencies in the right channel, one of ordinary skill in the art would know that the invention could be implemented in the left channel instead. No limitation is intended for application to one channel or the other. It should also be noted that the inclusion of other filtering techniques, such as infrasonic filtering for protection to roll off subsonic frequencies, does not affect or limit the selective signal inversion configuration, as described herein. In addition, extension of low frequency signals for bass boost or bass frequency signal processing (such as subharmonic generation) also do not limit or change the fundamental operation of the embodiments, as depicted herein.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method for creating a third channel from an input signal received in each of a first and second channel, comprising the steps of:

receiving an input signal in each of a first and second channel;

passing high frequency signals in each of the first and second channels;

summing the input signal in the first channel with the input signal in the second channel to produce a summed signal;

amplifying the summed signal in accordance with a predetermined gain to produce an amplified summed signal;

passing low frequency signals in the amplified summed signal;

combining the passed high frequency signals in the first channel with the amplified summed signal to produce a first combined signal;

inverting the amplified summed signal to produce an inverted summed signal, wherein the low frequency signals of the inverted summed signal are out of phase with the low frequency signals in the first combined signal; and combining the passed high frequency signals in the second channel with the inverted summed signal to produce a second combined signal.

2. The method of claim 1, further comprising the steps of:

amplifying the first combined signal to produce a first channel output signal; and amplifying the second combined signal to produce a second channel output signal.

3. The method of claim 2, further comprising the steps of:

communicating the first channel output signal to a first speaker and a first input on a third speaker; and communicating the second channel output signal to a second speaker and to a second input on the third speaker, wherein the third speaker produces low frequency sounds in accordance with a differential between the first and second channel output signals communicated to the third speaker.

4. The method of claim 1, wherein the predetermined level of gain controls the amplitude of the low frequency signals communicated in the third channel.

5. The method of claim 1, further comprising the steps of:

amplifying the second combined signal to produce a first channel output signal; and communicating the amplified second combined signal to a first speaker and to an input on a second speaker.

6. An apparatus for creating a third channel from an input signal received in each of a first and second channel, comprising:

a high pass filter to pass high frequency signals in each of the first and second channels;

a summing circuit configured to sum the input signal in the first channel with the input signal in the second channel, wherein the summing circuit produces a summed signal;

a low pass filter configured to pass low frequency signals in the summed signal, wherein the low pass filter outputs a low frequency summed signal;

a first channel combining circuit configured to combine the high frequency signals in the first channel with the low frequency summed signal to produce a first channel output signal; and a second channel combining circuit configured to combine the high frequency signals in the second channel with the low frequency summed signal to produce a second channel output signal, wherein the low frequency signals in the second channel output signal are out of phase with the low frequency signals in the first channel output signal.

7. The apparatus for claim 6, wherein the second channel combining circuit inverts the low frequency summed signal to produce the second channel output signal.

8. The apparatus for claim 6, further comprising:

an amplifier configured to modify the amplitude of the summed signal in accordance with a predetermined gain.

9. The apparatus for claim 6, further comprising:

a first channel amplifier configured to modify the amplitude of the first channel output signal, wherein the amplified first channel output signal is communicated to a first speaker and to the first input of a third speaker;

wherein the second channel combining circuit modifies the amplitude of the second channel output signal; and wherein the second channel output signal is communicated to a second speaker and the second input of the third speaker.

10. The apparatus for claim 6, wherein the high pass filter, summing circuit, low pass filter, first and second channel combining circuits are contained in a first enclosure coupled to a first and second amplifiers configured to amplify the first and second channels, the first and second amplifiers contained in a second enclosure.

* * * * *